United States Patent [19]
Tada et al.

[11] Patent Number: 4,720,671
[45] Date of Patent: Jan. 19, 1988

[54] SEMICONDUCTOR DEVICE TESTING DEVICE

[75] Inventors: Tetsuo Tada; Keiichi Sawada, both of Itami, Japan

[73] Assignee: Mitsubishi Denki Kabushiki Kaisha, Tokyo, Japan

[21] Appl. No.: 760,776

[22] Filed: Jul. 31, 1985

[30] Foreign Application Priority Data

Aug. 6, 1984 [JP] Japan .................... 59-165858

[51] Int. Cl.⁴ .......................................... G01R 31/28
[52] U.S. Cl. .......................... 324/73 R; 324/158 R
[58] Field of Search ............ 324/73 R, 73 PC, 158 R, 324/73 AT; 371/20, 25

[56] References Cited

U.S. PATENT DOCUMENTS 3,490,041 1/1970 Shapiro et al. .................. 324/73 R
4,651,088 6/1985 Sawada ............................ 324/73 R

FOREIGN PATENT DOCUMENTS 5718593 4/1978 Japan .

Primary Examiner—Ernest F. Karlsen
Attorney, Agent, or Firm—Birch, Stewart, Kolasch & Birch

[57] ABSTRACT

A semiconductor device testing device for testing a semiconductor device having input/output terminals includes a dynamic load circuit provided for each of the input/output terminals of the semiconductor device and a comparator provided for each of the input/output terminals of the semiconductor device which compares the voltage value obtained at the input/output terminal with a predetermined value to detect whether the internal state of the semiconductor device is a high impedance state or not. The confirmation of the electrical connection between the semiconductor device and the testing device is thereby conducted by the dynamic load circuit and the comparator.

4 Claims, 6 Drawing Figures

SEMICONDUCTOR DEVICE TESTING DEVICE

FIELD OF THE INVENTION

The present invention relates to a semiconductor device testing device which is capable of confirming the electrical connection between the testing device itself and the semiconductor device to be tested.

BACKGROUND OF THE INVENTION

In order to explain the background of the present invention, a prior art semiconductor device testing device (hereinafter referred as "a tester") is described with reference to FIG. 1:

The reference numeral 1 designates a semiconductor device to be measured (hereinafter referred to as "DUT" (device under a test)). The numeral 2 designates a tester which includes a constant voltage source 7 and a constant current source 8 (both hereinafter referred to as "PMU" (precision measurement unit)). The numerals 1a, 1b, 1c, ..., 1l designate input/output terminals of the DUT 1. The PMUs 7 and 8 are those which are normally included in a tester for the DC measurement of a semiconductor device. The DUT 1 has such a structure that the input/output terminal 1a is connected with a bonding pad 4 which is fine-processed on the semiconductor chip 3 through a conductor wire 1a' such as a gold or aluminium fine wire. The numeral 5 designates a package including the semiconductor chip 3 and the terminal 1a.

The confirmation of the electrical connection between the DUT 1 and the tester 2 is executed by applying a voltage or a current to the terminals 1a to 1l of the DUT 1 by the constant voltage source 7 or the constant current source 8 included in the tester 2, and measuring the value of the current or the voltage.

FIG. 3 shows an electric circuit inside the DUT 1 viewed from the bonding pad 4 wherein the portion at the right side beyond the broken lines constitutes a circuit in the semiconductor chip of the DUT 1. A protection circuit is normally adopted at the input/output terminals of the semiconductor device, and a diode 5 and a resistance 6 are used to form a protection circuit in FIG. 2 as generally employed. The electrical connection between the DUT 1 and the tester 2 is confirmed by measuring the forward current of the diode 5, thereby enabling detection of a breakage of a wire between the tester 2 and the DUT 1, and a breakage of a fine-processed wire such as aluminium wire from one of the terminals 1a to 1l of the DUT 1.

A method for detecting the breakage of a wire is exemplified with reference to FIG. 4:

When a constant current source 8 having a current value Io ($\mu A$) is connected to a terminal 4, the voltage Vo generated by the forward voltage of the diode 5 and the resistance 6 becomes as follows:

$$Vo = Io(\mu A) \times Ro(\Omega)$$

When a wire between the ground GD of the semiconductor device and the earth GT of the tester 2 is broken, the above-described value of Vo varies to a great extent. So, when it is detected a value beyond the expected range of the value Vo (Vomin to Vomax), it can be judged that the electrical connection between the DUT 1 and the tester 2 is insufficient or in a bad condition. Otherwise, the same effect can be obtained by connecting a constant voltage source 7 and detecting the current value as shown in FIG. 5.

Under such a prior art testing method, detection is performed by using the constant current source 8 or the constant voltage source 7. However, in these devices a time period of approximately several m-secs is required to obtain an exact predetermined voltage or current value. Furthermore, the constant voltages or current sources applicable for such use are expensive, thereby restricting the number of these devices included in a tester. Accordingly, the time required for the confirmation of electrical connections of DUT having a plurality of input/output terminals has increased with the increase of the number of the terminals. Furthermore, although it is possible to reduce the test time in using PMUs by including the same number of PMUs in the tester as that of the terminals to be measured, it is disadvantageous to change the tester function for the purpose of this connection test as the PMUs are expensive.

As another prior art there is Japanese Patent Publication No. Sho. 57-18593 entitled "A testing method for a tri-state output semiconductor memory device".

SUMMARY OF THE INVENTION

The present invention is directed to solve the problems pointed out above, and has for its object to provide a semiconductor device testing device capable of conducting a short time confirmation of the operation of the semiconductor device at the highest operational speed of the tester irrespective of the size of the number of terminals.

Another object of the present invention is to provide a semiconductor device testing device of a low cost.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semiconductor device testing device for testing a semiconductor device having input/output terminals, which includes: a dynamic load circuit provided in plurality corresponding to each of the input/output terminals of the semiconductor device, and a comparator which corresponds to each of the input/output terminals of the semiconductor device, for comparing the voltage value obtained at the input/output terminal with a predetermined value to detect whether the internal state of the semiconductor device is a high impedance state or not to determine the electrical connection between the semiconductor device and the testing device.

DETAILED DESCRIPTION OF THE PREFERRED EMBODIMENTS

Figure 1:
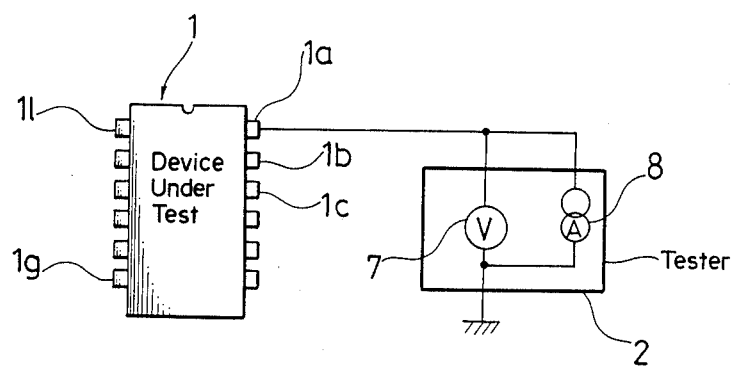
FIG. 1 is a circuit diagram showing a construction for conducting a test of an electrical connection between a conventional tester and a DUT.
Figure 2:
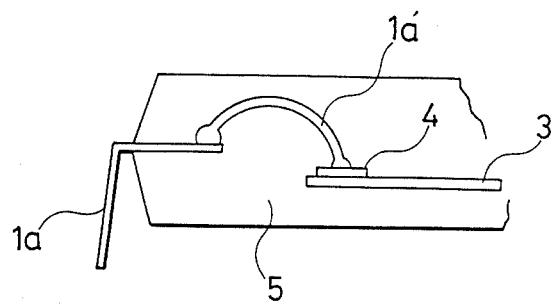
FIG. 2 is a cross-sectional view showing a DUT constructed in a package.
Figure 3:
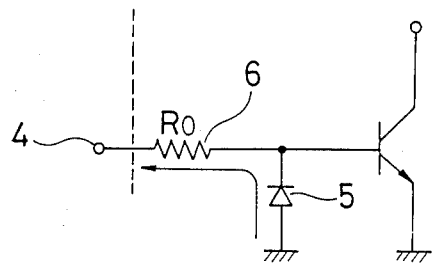
FIG. 3 is a circuit diagram showing a protection circuit of the DUT.
Figure 4:
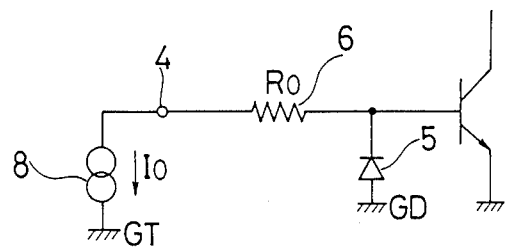
FIG. 4 is a circuit diagram showing a construction for conducting a test of an electrical connection between the DUT and a tester.
Figure 5:
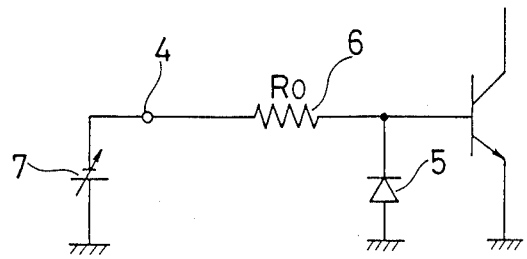
FIG. 5 is a circuit diagram showing a construction for conducting a test of an electrical connection between the DUT and a tester.
Figure 6:
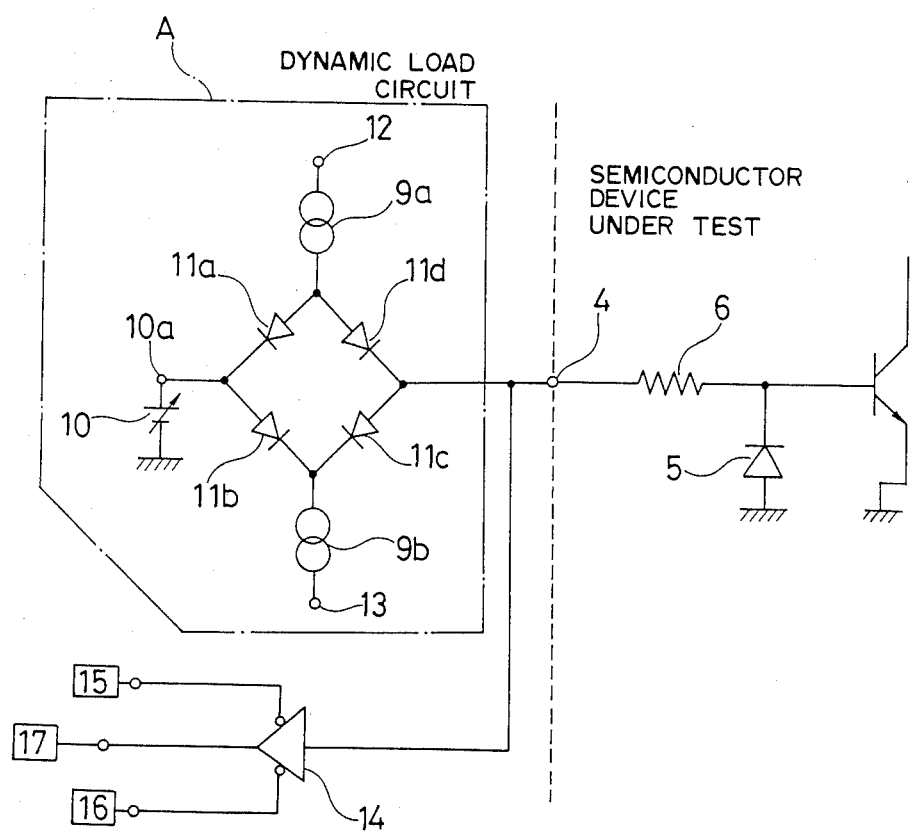
FIG. 6 is a circuit diagram showing a construction of a semiconductor device testing device as one embodiment of the present invention.

In order to explain one embodiment of the present invention in detail, the reference will be particularly made to FIG. 6:

In FIG. 6 the reference character A designates a dynamic load circuit (also called as a programmable circuit) included in the tester so as to conduct an impedance measurement for detecting whether the internal state of the semiconductor device is a high impedance state or not. This dynamic load circuit is provided in plurality corresponding to input/output terminals of the semiconductor device to be measured in combination with the comparator described later, and is operable at the highest operational frequency of the tester 2 (usually 20 to 100 MHz). The numerals 9a and 9b designates a constant current source for the dynamic load circuit A, the numerals 11a to 11d designate diodes which constitute a diode bridge circuit for holding the voltages appearing at the terminals 10a and 4 at equal values such that a current flow out from the terminal 12 and into the terminal 13. The numeral 10 designates a reference voltage generator which lowers the voltage difference between the terminals 12, 13 and the DUT terminal 4 by changing the direction of the current from the terminal 12 to the terminal 13. The numeral 14 designates a comparator which compares the voltage generated at the terminal 4 and the values established at the upper limit register 15 and the lower limit register 16. The numeral 17 designates a flag value register for outputting an output based on the result of pass or fail from the comparator 14. The flag value register 17 usually outputs a signal corresponding to "1" or "0". In FIG. 6, the portion at the right side beyond the brokens lines constitutes a circuit in a DUT chip similarly as in FIG. 4.

The device will be operated as follows:

Firstly, the dynamic load circuit A is connected to each of the input/output terminals 4 of the semiconductor device. The current values to be generated by the constant current sources 9a, 9b are given properly, and a voltage value lower or higher than the voltage value which is expected to be generated at the terminal 4 of the semiconductor device from the current values is given to the terminal 10a by the constant voltage source 10. When the voltage at the terminal 10a is higher than that at the terminal 4, a current mainly flows from the constant current source 9a, through the diode 11d, through the diode 11c, and to the constant current source 9b. When the voltage at the terminal 10a is lower than that at the terminal 4, a current mainly flows from the diode 5 of the DUT, through the resistance 6, through the diode 11c of the tester, and to the constant current source 9b. Thus, regardless whether the voltage at the terminal 10a is higher or lower than the voltage at the terminal 4, the voltages at terminals 4 and 10a are approximately equal to each other due to the function of the diode bridge circuit. The transition time for reaching a steady state is determined in accordance with the current values of the constant current sources. Then, the voltage value at the terminal 4 in the steady state is determined the current value of the constant current source 9b which flows from the diode 5, through the DUT resistance 6 and the diode 11c of the tester, to the constant current source 9b, and accordingly, a little lower and higher values than that value to be generated at the terminal 4 are previously established at the upper and lower limit registers 15, 16 as the values to be compared with the voltage value obtained at the terminal 4. The voltage value generated at the terminal 4 is compared with the upper and lower limit set value 15, 16 by the comparator 14 to output "1" (pass) when the voltage value is within a range between these set values, and to output "0" (fail) otherwise to the signal processor of the tester, thereby enabling to detect the goodness of the connection between the tester and the DUT.

In this embodiment, the confirmation of the electrical connection between the semiconductor device testing device and the semiconductor device to be tested is conducted by using a dynamic load circuit and a comparator which is operable at the highest frequency of the testing device. Accordingly, the check of the electrical connection therebetween is carried out at a high speed, and the test time is not increased regardless of the increase of the number of input/output terminals of the semiconductor device to be tested. Furthermore, the device is constituted at a low cost.

In the illustrated embodiment, only the connection test of the DUT is carried out, but test items including static electrical characteristics which are conventionally measured by PMUs can be carried out by adopting equipment having high performance (high preciseness and high resolvability) elements 10, 11a, 11b, 11c, 11d, 9a, 9b which constitute a bridge circuit included in a tester shown in FIG. 6. Presently, PMUs are superior to this device in the preciseness in measurement by several times or several tens times. However, it is possible to obtain the measured results of similarly high preciseness as in the conventional PMUs in a short time by enhancing the performance of the bridge circuit such that the measuring range becomes approximately equal to that of PMU.

As evident from the foregoing, according to the present invention, the connection check between the tester and the DUT having a plurality of input/output terminals are conducted by using a comparator and a dynamic load circuit included in a general tester. This construction enables a short time test. Furthermore, it can be obtained a cheap device realizing a high speed test.

What is claimed is:

1. A semiconductor device testing device for testing a semiconductor device having input/output terminals, which comprises:
    a dynamic load circuit provided for each of the input/output terminals of the semiconductor device, said dynamic load circuit including,
    first and second voltage sources,
    a first constant current source,
    a second constant current source,
    a diode bridge connected in series between said first and second constant current sources across said first and second voltage sources, said diode bridge including first and second balanced voltage terminals,
    a variable voltage source connected to said first balanced voltage terminal,
    the second balanced voltage terminal being connected to a said input/output terminal of said semiconductor device;

a comparator, operatively connected to each of the input/output terminals of the semiconductor device, for comparing the voltage value obtained at the input/output terminal with a predetermined value to detect whether the internal state of the semiconductor device is a high impedance state or not in order to determine the quality of the electrical connection between the semiconductor device and the testing device.

2. A semiconductor device testing device as set forth in claim 1, wherein the comparator is connected to each of the input/output terminals in parallel with the dynamic load circuit.

3. A semiconductor device testing device as set forth in claim 1, wherein the comparator compares the voltage value obtained at the input/output terminal of the semiconductor device with an upper limit preset value and a lower limit preset value established higher and lower than a value to be obtained at the terminal when in a stationary state.

4. The semiconductor device testing device of claim 1 wherein said variable voltage source applies a negative voltage to said first balanced voltage terminal, said comparator comparing the voltage values at said input/output terminal of said semiconductor device with first and second predetermined values to detect whether said voltage value falls within a predetermined range including that the quality of the electrical connection between said semiconductor device and said testing device is good.

* * * * *